(12) United States Patent
Mardilovich et al.

(10) Patent No.: US 7,285,501 B2
(45) Date of Patent: Oct. 23, 2007

(54) METHOD OF FORMING A SOLUTION PROCESSED DEVICE

(75) Inventors: Peter Mardilovich, Corvallis, OR (US); Randy Hoffman, Corvallis, OR (US); Gregory Herman, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 313 days.

(21) Appl. No.: 10/943,606

(22) Filed: Sep. 17, 2004

(65) Prior Publication Data

US 2006/0060857 A1    Mar. 23, 2006

(51) Int. Cl.
*H01L 21/4757* (2006.01)

(52) U.S. Cl. ............... 438/763; 438/781; 438/782; 438/785; 257/E21.242

(58) Field of Classification Search ............... 438/782
See application file for complete search history.

(56) References Cited

U.S. PATENT DOCUMENTS

| | | | |
|---|---|---|---|
| 5,946,551 A | 8/1999 | Dimitrakopoulos et al. | |
| 6,312,204 B1 | 11/2001 | Spiel et al. | |
| 6,448,592 B1 | 9/2002 | Peek et al. | |
| 6,501,096 B1 * | 12/2002 | Hashimoto et al. | 257/59 |
| 6,506,438 B2 | 1/2003 | Duthaler et al. | |
| 6,650,380 B2 | 11/2003 | Song | |
| 7,081,640 B2 * | 7/2006 | Uchida et al. | 257/40 |
| 2002/0126243 A1 | 9/2002 | Hibino et al. | |
| 2002/0142586 A1 * | 10/2002 | Shiota | 438/633 |
| 2003/0044618 A1 * | 3/2003 | Fan et al. | 428/413 |
| 2003/0059975 A1 | 3/2003 | Sirringhaus et al. | |
| 2003/0175411 A1 | 9/2003 | Kodas et al. | |
| 2003/0203643 A1 * | 10/2003 | Hasei et al. | 438/758 |
| 2004/0048423 A1 | 3/2004 | Van der Zaag et al. | |

FOREIGN PATENT DOCUMENTS

| | | |
|---|---|---|
| EP | 1443571 | 8/2004 |
| GB | 2067650 | 5/1982 |
| WO | WO 01/93336 | 12/2001 |

OTHER PUBLICATIONS

International Search Report dated May 3, 2006.

* cited by examiner

*Primary Examiner*—Stephen W. Smoot

(57) ABSTRACT

Embodiments of methods, apparatuses, devices, and/or systems for forming a solution processed device are described.

29 Claims, 4 Drawing Sheets

METHOD OF FORMING A SOLUTION PROCESSED DEVICE

BACKGROUND

Electronic devices, such as integrated circuits, solar cells, and/or electronic displays, for example, may be comprised of one or more electrical devices, such as one or more thin film transistors (TFTs). Methods and/or materials utilized to form electrical devices such as these may vary, and one or more of these methods and/or materials may have particular disadvantages. For example, use of such methods and/or materials may be time-consuming and/or expensive, may involve the use of high temperature processing, and/or may not produce devices having the desired characteristics.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

DETAILED DESCRIPTION

Figure 1:
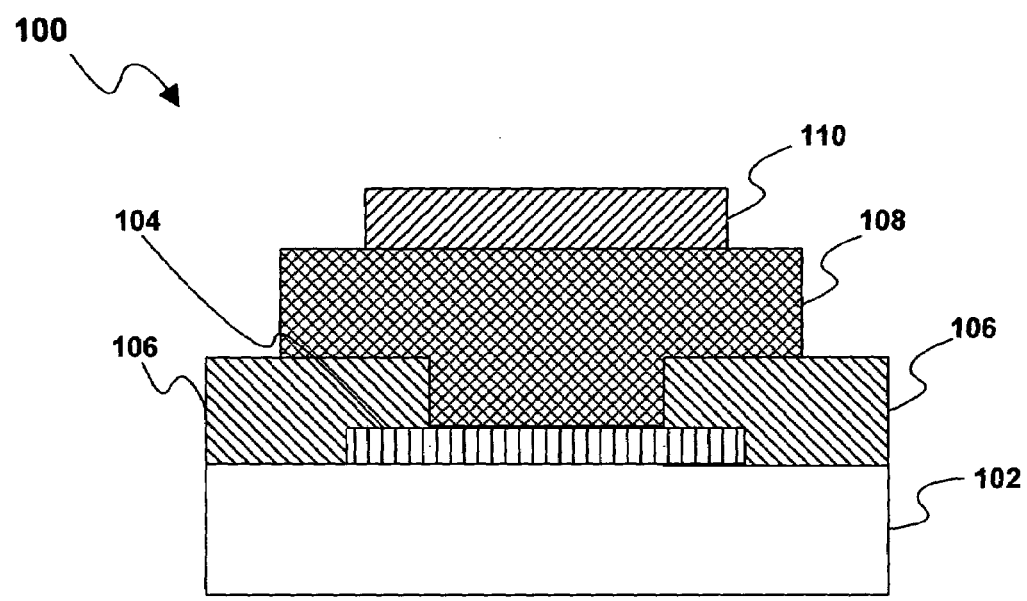
FIG. 1 is a cross sectional view of one embodiment of a solution processed device.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Electronic devices, such as semiconductor devices, display devices, nanotechnology devices, conductive devices, and/or dielectric devices, for example, may be comprised of one or more thin films, which may additionally be referred to as device layers, and one or more device layers may be comprised of one or more layers of material, referred to as material layers, for example. In this context, the term thin film refers to a layer of one or more materials formed to a thickness, such that surface properties of the one or more materials may be observed, and these properties may vary from bulk material properties, for example. The one or more device layers may be further comprised of one or more material layers, and the one or more materials comprising the material layers may have electrical and/or chemical properties, such as conductivity, chemical interface properties, charge flow, and/or processability, for example. The one or more material layers may additionally be patterned, and, in combination with one or more other material layers, may form one or more device layers, which, in combination with one or more other device layers, may form one or more electrical devices, such as thin film transistors (TFTs), capacitors, diodes, resistors, photovoltaic cells, insulators, conductors, optically active devices, or the like. Thin film devices, such as TFTs, in particular, may, for example, be utilized in display devices including, for example, an electroluminescent and/or a liquid crystal display (LCD).

At least as part of the fabrication process of electronic devices, such as thin film devices, including, for example, thin film transistors, one or more layers of material may be formed at least as part of one or more of the device layers, such as by forming a dielectric layer as part of a thin film transistor, wherein the dielectric layer is comprised of multiple material layers, for example. In this embodiment, as at least a part of the fabrication process, one or more material layers may be formed by use of one or more formation processes, and/or by use of one or more materials, such as a combination of materials, for example. In one particular embodiment, at least a portion of a device, such as a thin film device, may be formed by use of one or more processes, at least one of which may be referred to as solution processing, for example. Solution processing, as used in this context, comprises one or more processes, wherein a solution, such as a substantially liquid solution, for example, which may additionally be referred to as a liquid precursor in at least one embodiment, may be deposited on one or more surfaces of a device, such as on one or more surfaces of a substrate, by use of one or more deposition processes. Devices, such as electronic device, including TFTs, for example, which may be at least partially formed by one or more processes such as solution processes may be referred to as solution processed devices, for example. In one embodiment of solution processing, an ejection mechanism, such as an ink jet device, may deposit and/or jet one or more materials onto a surface, in order to substantially form a material layer, for example. Additionally, one or more spin coating processes and/or one or more contact printing processes, wherein one or more printing devices may be capable of printing materials, such as liquid materials, on to a surface, may be utilized in one or more embodiments of solution processing, although these are just a few examples, and claimed subject matter is not so limited. For example, one or more dip coating and/or spray coating processes, one or more curtain coating, screen printing, chemical bath deposition processes and/or successive ionic layer absorption and reaction processes may be utilized in one or more embodiments of solution processing, for example. Additionally, as used herein, an ejection device, such as a jetting device, including an ink jet device, may comprise a mechanism capable of ejecting material such as ink, for example, and may eject material in the form of drops, for example, such as mechanically and/or electrically, and/or in response to electrical signals, and may be capable of ejecting material in controlled portions, in a controlled manner, and/or in a controlled direction, for example. Additionally, an ejection device may operate by use of one or more ejection schemes, including piezo ejection, thermal ejection, and/or flex tensioned ejection, for example, but, again, claimed subject matter is not limited to these examples.

Although claimed subject matter is not so limited, in one particular embodiment, an electronic device, such as a thin film device, may comprise at least one device layer, wherein the at least one device layer comprises two or more layers of material, such as differing material and/or material having differing characteristics, for example. In at least one embodiment, at least a portion of the device may be conductive and/or insulative, for example, and, in at least one embodiment, at least one material layer may substantially comprise inorganic material, and at least one material layer may substantially comprise organic material, for example. It is, of course, understood, that the claimed subject matter is not limited in scope to which material is inorganic and which material is organic. For example, an inorganic material may reside over or on an organic material and vice-versa. Likewise, in some embodiments, additional material layers may also be included, depending at least in part on the particular embodiment. Furthermore, as used herein, conductive, when used, such as with conductive device layers, generally refers to the capability to at least partially conduct electricity, and may comprise a structure that is conductive, semiconductive, and/or partially conductive, such as a structure exhibiting one or more dielectric properties, for example.

Referring now to FIG. 1, there is illustrated a cross-sectional view of one embodiment 100 of an electronic device in a stage of formation. Embodiment 100, here, comprises substrate 102, with one or more device layers 104, 106, 108, and/or 110 formed thereon. In one particular embodiment, device layer 104 may comprise a channel layer; device layer 106 may comprise an electrode layer, and may further comprise a drain and/or source electrode, for example; device layer 108 may comprise a dielectric layer; and device layer 110 may comprise a gate layer, and, in this particular configuration, device 100 may be referred to as a top gate thin film transistor, which may refer to a transistor configured to have a gate layer formed on or over a dielectric layer, for example, although it is desirable to note that this is just one embodiment, and claimed subject matter is not limited in this respect, but may comprise other configurations such as a bottom gate transistor, which may refer to a transistor configured to have a gate layer formed below a dielectric layer, as just an example. Additionally, it is noted, of course, here and through out this description that claimed subject matter is not limited to the foregoing layers being formed on one another. For example, other layers may be included, such as between various layers, so that layers may be formed above or over one another rather than on one another, depending, for example, on the particular embodiment.

However, in this particular embodiment, although claimed subject matter is not limited to any particular material and/or combination of materials to form one or more of the layers and/or devices illustrated in FIG. 1, in at least one embodiment, one or more of the device layers may comprise one or more of the materials described below. Additionally, it is desirable to note that claimed subject matter is not limited in this respect, and one or more of the device layers may comprise any material or combination of materials suitable for use as one or more device layers, such as any material exhibiting properties suitable for application as one or more device layers in an electronic device, for example. In this embodiment, where device layer 102 comprises a substrate layer, device layer 102 may comprise one or more materials suitable for use as a substrate, including, for example, silicon, silicon dioxide, one or more types of glass, one or more organic substrate materials, such as polyimide (PI, Kapton®), polyethylene terephthalate (PET), polyethersulfone (PES), polycarbonate (PC), polyethylenenaphthalate (PEN), poly(methyl methacrylate) (PMMA), stainless steel and/or metal foils, including foils of aluminum and/or copper, for example, but claimed subject matter is not so limited. Additionally, in at least one embodiment, wherein a substrate material is substantially comprised of one or more metals, an insulator layer may be utilized in addition to the one or more metals, for example. Additionally, in this particular embodiment, device layer 104 may comprise a channel layer. Device layer 104 may be comprised of one or more materials suitable for use as a channel layer, including, for example, metal oxides such as zinc oxide, tin oxide, indium oxide, gallium oxide, and/or combinations thereof; silicon, including amorphous, nanowire, microribbon, and/or polycrystalline silicon; carbon nanotubes, GaAs, Ge, CdS, CdSe, ZnS, ZnSe, $SnS_2$, $SnSe_2$, and/or combinations thereof, for example. In this embodiment, wherein device layer 106 comprises an electrode layer, and may be comprised of one or more source and/or drain electrodes, for example, at least a portion of device layer 106 may be substantially comprised of indium tin oxide; other doped oxide semiconductors, such as n-type doped zinc oxide, indium oxide, and/or tin oxide, and/or metals, such as Al, Ag, In, Sn, Zn, Ti, Mo, Au, Pd, Pt, Cu, and/or Ni, as just a few examples. Additionally, in this embodiment, wherein device layer 110 comprises a gate layer, device layer 110 may be comprised of metals, such as Al, Ag, In, Sn, Zn, Ti, Mo, Au, Pd, Pt, Cu, Ni; doped oxide semiconductors, such as n-type doped zinc oxide, indium oxide, and/or tin oxide, as just a few examples. Additionally, device layer 108 may comprise a dielectric layer, for example. In one embodiment, device layer 108 may comprise one or more inorganic and/or organic materials, such as one or more material layers substantially comprising inorganic dielectric material, and/or one or more material layers substantially comprising organic dielectric materials. In at least one embodiment, one or more inorganic dielectric materials may be comprised of zirconium oxide, tin oxide, titanium oxide, tantalum oxide, yttrium oxide, lanthanum oxide, silicon oxide, aluminum oxide, hafnium oxide, barium zirconate titanate, barium strontium titanate, silicon nitride, and/or silicon oxynitride, as just a few examples. Additionally, one or more organic dielectric materials may be substantially comprised of UV curable acrylic monomer, acrylic polymer, UV curable monomer, thermal curable monomer, polymer solution, including melted polymer and/or oligomer solution, poly methyl methacrylate, poly vinylphenol, benzocyclobutene, and/or one or more polyimides, as just a few examples.

As alluded to previously, and as will be explained in more detail later, one or more of these materials may have particular advantages and/or disadvantages. For example, in one embodiment, one or more organic materials may be more readily processed into a device layer as compared to one or more inorganic materials, such as by having the capability of being processed at a relatively lower temperature as compared to one or more inorganic materials, but may not exhibit particularly desirable characteristics, such as by not exhibiting particularly desirable chemical and/or electrical interface characteristics, such as by exhibiting reduced film quality, channel mobility capabilities, and/or charge transport properties, which may aid reliability, for example. Comparably, in one embodiment, one or more inorganic materials may exhibit one or more desirable characteristics, such as desirable chemical and/or electrical interface characteristics, such as desirable film quality, channel mobility capabilities, and/or charge transport properties, which may aid reliability, for example, but may be comparatively difficult to process. For example, inorganic materials may be processed at relatively higher temperatures than organic materials, for example. It is noted, of course, here and through out this description that claimed subject matter is not so limited, and these particular advantages and/or disadvantages are used for illustrative purposes only, and particular materials utilized in one or more embodiments may not necessarily exhibit one or more of these characteristics.

Figure 2:
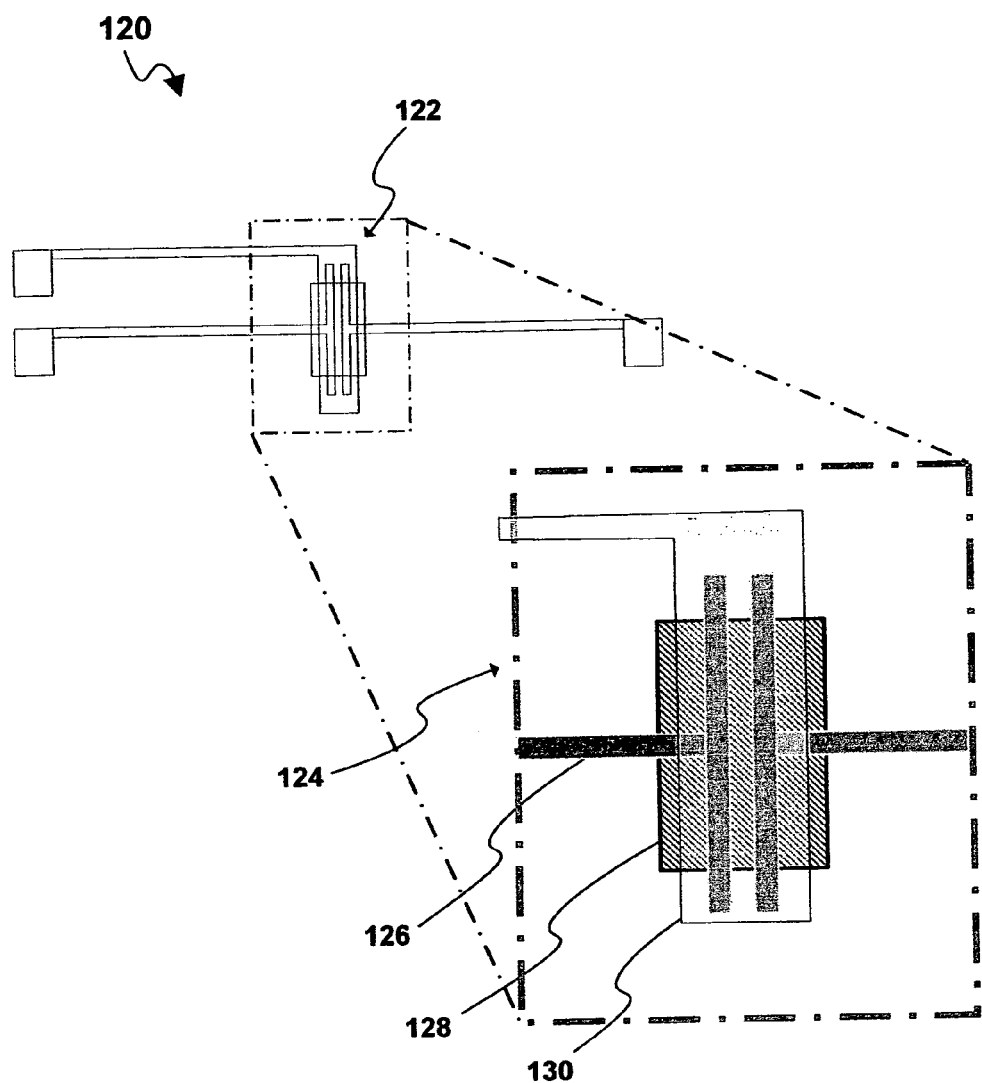
FIG. 2 is a plan view of one embodiment of a solution processed device.

Referring now to FIG. 2, there is illustrated an embodiment 120 of a solution processed device, illustrated as a plan view. Device 122, here, may comprise a thin film device, such as device 100 of FIG. 1, for example, and may comprise a top gate thin film transistor, although claimed subject matter is not limited in this respect. Additionally, device 122 may comprise a portion of an electronic device, such as an LCD device, as just an example. In this embodiment, device 122 may comprise a channel portion 128; an electrode portion 126, which may comprise a source and/or drain, a dielectric portion 124; and a gate portion 130, although, again, claimed subject matter is not so limited. Additionally, one or more of the foregoing portions may be formed on or over a substrate (not shown), for example, and may substantially comprise layers, such as one or more material layers and/or device layers, for example. In one particular embodiment, one or more of the portions may be formed proximate to one or more other portions, such as above and/or below one or more portions, such as in a similar configuration as the embodiment 100 illustrated in FIG. 1, for example, although claimed subject matter is not so limited. However, in this embodiment, channel portion 128 and electrode portion 126 may be formed on a substrate (not shown). Dielectric portion 124 may be formed on at least a portion of electrode portion 126 and/or channel portion 128. Formed on at least a portion of dielectric portion 124 is gate portion 130, in this particular embodiment.

Additionally, and as described in reference to FIG. 1, although claimed subject matter is not limited to any particular material and/or combination of materials to form one or more of the layers and/or devices illustrated in FIG. 2, in at least one embodiment, one or more of the device layers may comprise one or more of the aforementioned materials. However, similar to FIG. 1, it is desirable to note that claimed subject matter is not limited in this respect, and one or more of the device layers may comprise any material or combination of materials suitable for use as one or more device layers, such as any material exhibiting properties suitable for application as one or more device layers in an electronic device, for example.

Formation of one or more layers of device 100 of FIG. 1 and/or device 122 of FIG. 2 may comprise one or more processes, and/or numerous process operations, but claimed subject matter is not limited to any particular method of formation of one or more layers and/or one or more electrodes of device 100. However, in at least one embodiment, one or more solution processes may be utilized, such as one or more of the following: one or more ejection processes, including, for example, one or more ink jet processes, one or more thermal ink jet processes, one or more contact printing processes, one or more spin coating, dip coating, spray coating, curtain coating and/or screen printing processes, and/or chemical bath deposition and/or successive ionic layer absorption and/or reaction, as just a few examples, but again, claimed subject matter is not so limited. Particular methods of formation of the devices illustrated herein may be better understood when explained with reference to FIG. 3, below.

Figure 3:
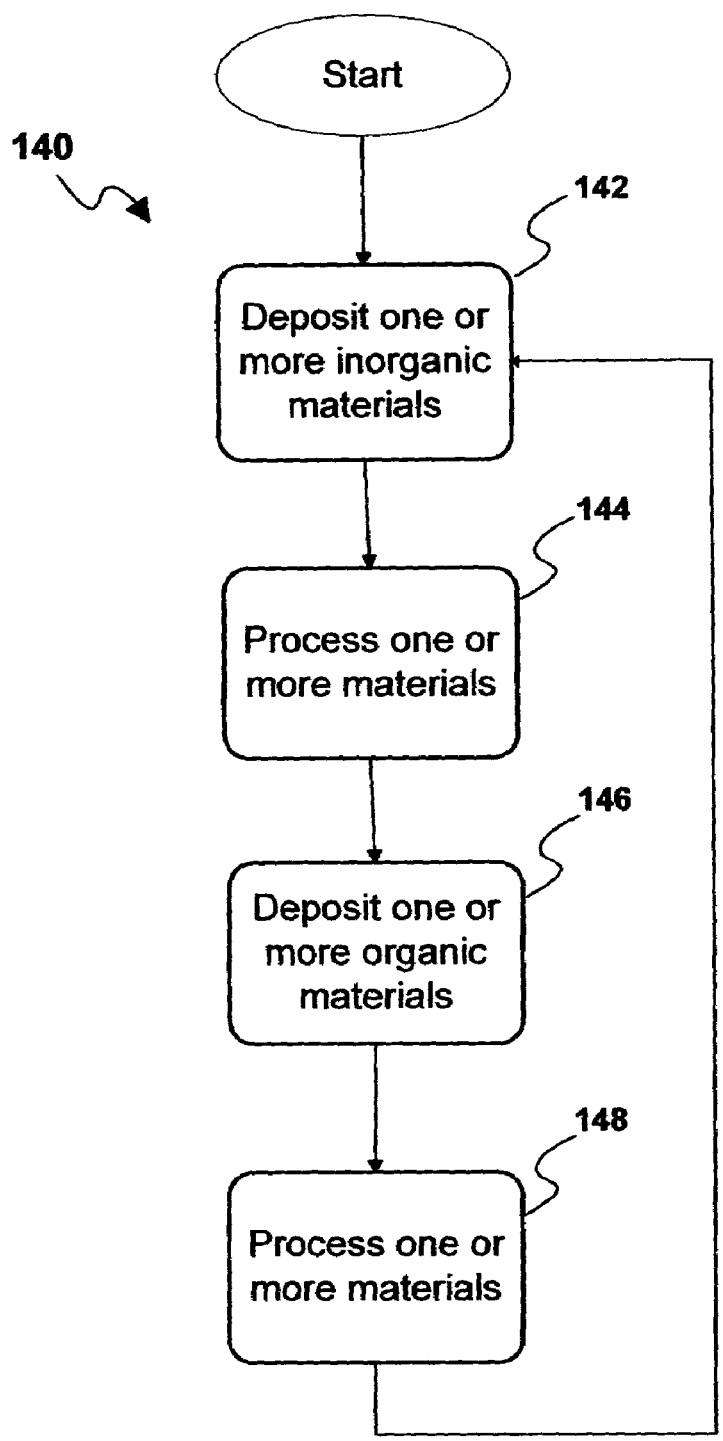
FIG. 3 is a flowchart illustrating one embodiment of a method to form a solution processed device.

Referring now to FIG. 3, one embodiment of a technique for forming a solution processed device is illustrated by a flowchart, although, of course, claimed subject matter is not limited in scope in this respect. Such an embodiment may be employed to at least partially form a solution processed device, as described below. The flowchart illustrated in FIG. 3 may be used to form a device at least in part, such as device 100 of FIG. 1 and/or device 122 of FIG. 2, for example, although claimed subject matter is not limited in this respect. Likewise, the order in which the blocks are presented does not necessarily limit claimed subject matter to any particular order. Additionally, intervening blocks not shown may be employed without departing from the scope of claimed subject matter.

Flowchart 140 depicted in FIG. 3 may, in alternative embodiments, be implemented in software, hardware and/or firmware, such as part of a computer controlled formation system capable of forming one or more portions of a device, such as device 100 of FIG. 1 and/or device 122 of FIG. 2, for example, and may comprise discrete and/or continual operations. In this embodiment, at block 142, one or more inorganic materials may be deposited on or over at least a portion of a device, such as on one or more layers of a multilayer device, including, for example, a substrate layer, a channel layer, and/or an electrode layer, as just a few examples. At block 144, a portion of the one or more inorganic materials may be processed, such as by selectively removing at least a portion of the one or more organic materials, and/or altering at least a portion of the one or more inorganic materials, explained in more detail later. At block 146, one or more organic materials may be deposited on or over at least a portion of the one or more inorganic materials deposited at block 142. At block 148, similar to block 144, a portion of the one or more organic materials may be processed, such as by selectively removing at least a portion of the one or more organic materials, and/or altering at least a portion of the one or more inorganic materials, explained in more detail later.

In this embodiment, at block 142, one or more inorganic materials may be deposited on or over at least a portion of a device, such as on one or more layers of a multilayer device, including, for example, a substrate layer, a channel layer, and/or an electrode layer, as just a few examples. As illustrated in FIG. 1, one or more inorganic dielectric materials may be deposited such that at least a portion of a dielectric layer, such as dielectric layer 108, is formed. In this embodiment, one or more inorganic materials, such as zirconium oxide, tin oxide, titanium oxide, tantalum oxide, yttrium oxide, lanthanum oxide, silicon oxide, aluminum oxide, hafnium oxide, barium zirconate titanate, barium strontium titanate, silicon nitride, and/or silicon oxynitride, for example, may be formed on or over at least a portion of one or more device layers, such as at least a portion of electrode layer 106, and/or at least a portion of the channel layer 104, and/or at least a portion of the substrate layer 102, although, of course, claimed subject matter is not limited in this respect. Additionally, deposition of one or more inorganic materials may comprise one or more solution processes, including, for example, one or more ejection processes, such as one or more jetting processes, including thermal and/or piezo jetting, such as by use of an ink jet device, including a thermal ink jet (TIJ) device, for example. Additionally, one or more inorganic materials may be deposited by use of one or more solution processes, such as one or more contact printing processes and/or one or more coating processes, such as one or more spin coating processes. Additionally, although numerous materials or combinations of materials may be utilized to form a layer of inorganic material, and the material(s) utilized may depend, at least in part, on the particular process(es) utilized, in one embodiment, the inorganic material may substantially comprise zirconium oxide, and may be deposited by use of one or more thermal jetting processes, as just an example. Additionally, the one or more materials deposited may be in one or more forms, such as in a substantially liquid form, in a nanoparticle suspension form, in an inorganic polymer sol-gel precursor form (a sol-gel comprises partially hydrolyzed/oligomerized metal alkoxides in an alcohol solution), and/or one or more types of oxide and/or precursor forms, such as metal alkoxides, metal salts, and/or partially polymerized metal alkoxides, as just a few examples. In one embodiment, a nanoparticle suspension may comprise nanoparticles of $SiO_2$ suspended in a solvent of water, glycol, and/or alcohol, such as ethylene glycol and/or isopropyl alcohol. The nanoparticles of $SiO_2$ may have a diameter of approximately 20 nanometers, and may comprise approximately 15-30% of the solution by weight. Additionally, the material(s) deposited may be deposited to a thickness, such as a thickness in the range of 1-500 nm, although the particular thickness may depend at least in part on one or more factors, such as the material(s) utilized to form the one or more layers, and/or the particular device being formed, for example. In one particular embodiment, wherein an inorganic material layer deposited such that at least a portion of a dielectric layer, such as dielectric layer 108, is formed, an inorganic material substantially comprising zirconium oxide may be deposited (from a sol-gel precursor) by one or more thermal ink jet processes, and may be deposited on or over a portion of a device layer of a thin film transistor to a layer having a thickness in the range of approximately 20-100 nm, although, again, claimed subject matter is not limited in this respect.

In this embodiment, at block 144, at least a portion of the one or more materials deposited at block 142 may be processed, although, in alternative embodiments, no processing may be performed, for example. Additionally, particular processing performed on the one or more materials may be selected based at least in part on the material(s) utilized to form the material layer, for example, and/or the particular device being formed, for example. In one embodiment, at least a portion of the one or more inorganic materials may be at least partially removed, such as by use of one or more laser ablation and/or chemical etching processes, for example, which may result in at least a portion of the one or more materials being patterned, for example. Additionally, one or more portions may be altered, such as by being cured and/or sintered, such as if at least a portion of the material(s) comprise a sol-gel precursor solution, such as a zirconium oxide sol-gel precursor in a mixture of isopropyl alcohol (IPA) and/or 1-butanol and buthyl 2-ethylhexanoate, for example. Curing, when used in this context, refers generally to a process wherein a liquid precursor is substantially transformed into a substantially solid film, such as an oxide film, and may comprise one or more solvent and/or organic group removal processes, and/or one or more decomposition of metal organic compound processes as a result from heating, for example, such as thermal, laser, microwave and/or other types of radiative heating. Additionally, sintering, when used in this context, refers generally to a process wherein multiple portions of a material, such as a metal material in the form of nanoparticles, for example, may become a substantially singular mass, as a result of melting and re-crystallization, such as result from heating, for example, such as thermal and/or laser heating. Additionally, one or more portions of one or more materials may be altered by being at least partially solidified, crystallized, polymerized, patterned, and/or having the density altered, but, again, particular processing performed on the one or more materials may be selected based at least in part on the material(s) utilized to form the material layer, for example, and/or the particular device being formed, for example.

In this embodiment, at block 146, one or more organic materials may be deposited on at least a portion of a device, such as on one or more inorganic materials deposited at block 142, for example. In this embodiment, one or more organic materials may comprise UV curable acrylic monomer, acrylic polymer, UV curable monomers, thermal curable monomers, polymer solutions such as melted polymers and/or oligomer solutions, poly methyl methacrylate, poly vinylphenol, benzocyclobutene, and/or one or more polyimides, as just a few examples, and may be formed on at least a portion of the inorganic material, although, of course, claimed subject matter is not limited in this respect, and at least a portion of the organic material may be deposited on one or more other device and/or material layers, for example. Additionally, in alternative embodiments, one or more organic material layers may be deposited prior to the deposition of one or more inorganic material layers, for example. Deposition of one or more organic materials may comprise one or more solution processes, including, for example, one or more ejection processes, such as one or more jetting processes, including thermal and/or piezo jetting, such as by use of an ink jet device, including a TIJ device, for example. Additionally, one or more organic materials may be deposited by use of one or more solution processes such as one or more contact printing processes and/or one or more coating processes, such as one or more spin coating. Additionally, although numerous materials or combinations of materials may be utilized to form a layer of organic material, and the material(s) utilized may depend, at least in part, on the particular process(es) utilized, in one embodiment, the organic material may substantially comprise a UV curable monomer, such as a UV curable acrylic monomer, and/or one or more polymers, such as acrylic polymer. In one exemplary embodiment, a UV curable acrylic monomer comprising Objet FullCure™ M 3D printing build material and available from Objet Geometries Inc. may be utilized. In this exemplary embodiment, the UV curable acrylic monomer may additionally comprise a photoinitiator for polymerization, and may be diluted in one or more alcohols, such as IPA, ethanol, and/or methanol, in order to decrease the UV curable monomer viscosity and to make it suitable for application in an ejection mechanism, for example.

The organic material may be deposited by use of one or more thermal jetting processes, as just an example. Additionally, the material(s) deposited may be deposited to a thickness, such as a thickness within the range of 50-5000 nm, although the particular thickness may depend at least in part on one or more factors, such as the material(s) utilized to form the one or more layers, and/or the particular device being formed, for example. In one particular embodiment, wherein an inorganic material layer is deposited such that at least a portion of a dielectric layer, such as dielectric layer 108, is formed, an organic material substantially comprising UV curable acrylic monomer, such as the aforementioned UV curable acrylic monomer Objet FullCure™ M may be deposited by one or more thermal ink jet processes, and may be deposited on a portion of a device layer of a thin film transistor to a layer having a thickness within the range of approximately 200-2000 nm, thus substantially forming a multilayer device, wherein at least a portion of the multilayer device comprises inorganic material, and at least a portion of the multilayer device substantially comprises organic material, although, again, claimed subject matter is not limited in this respect.

However, continuing with this embodiment, at block 148, at least a portion of the one or more materials deposited at block 146 may be processed, although, in alternative embodiments, no processing may be performed, for example. Additionally, particular processing performed on the one or more materials may be selected based at least in part on the material(s) utilized to form the material layer, for example, and/or the particular device being formed, for example. In one embodiment, at least a portion of the one or more organic materials may be at least partially removed, such as by use of one or more laser ablation processes, for example, which may result in at least a portion of the one or more materials being patterned, for example. Additionally, one or more portions may be cured and/or sintered, such as if at least a portion of the materials(s) include monomeric components, which may typically be polymerized to form a material layer comprising one or more polymerized monomers, for example. Thus, a device comprising one or more inorganic materials, and one or more organic materials, wherein at least a portion of the one or more materials substantially comprises a device layer, may be formed.

As alluded to previously, formation of a device layer, such as a dielectric layer wherein at least a portion of the dielectric layer comprises inorganic material, and at least a portion of the device layer comprises organic material, may result in the formation of a dielectric layer, and/or a device having particular characteristics that may vary from a device not being formed in this manner and/or from this particular combination of materials. For example, a dielectric layer of a thin film transistor may be formed in this manner, and may result in the formation of a thin film transistor having desirable characteristics, such as by having desirable dielectric properties including dielectric strength, breakdown field and/or current leakage properties, and/or additional properties including turn on voltage, drain current on/off ratio, channel mobility, bulk properties, defect density, dielectric constant, chemical and/or thermal stability, charge transport, physical adhesion strength for reliable operation and/or film quality, to name just a few examples, although claimed subject matter is not limited in this respect. For example, and, again, as alluded to previously, organic and/or inorganic materials may have particular characteristics when implemented in a device such as a thin film device. Inorganic materials, for example, may be processed into a thin film device by use of relatively high temperatures, such as by sintering, which may result in the formation of defects in the material layer, such as cracks and/or pinholes. This may affect film quality of the material layer, which may, for example, result in less than desirable performance in terms of electrical properties, such as dielectric breakdown field and/or current leakage properties, for example. However, inorganic materials may exhibit desirable thermal, electrical, and/or chemical properties. Conversely, organic materials may not utilize relatively high temperatures when being processed, and/or may be more readily processed such as by being more soluble than one or more inorganic materials, resulting in an improved film quality, and/or less complex processes, for example. However, organic materials may not provide particularly desirable thermal, electrical, and/or chemical properties, for example. Thus, formation of a device layer in accordance with one or more of the aforementioned embodiments, wherein the device layer comprises one or more organic and inorganic materials, may result in the formation of a device, such as a thin film device, having desirable characteristics, such as characteristics not exhibited by a device formed from only organic and/or inorganic materials, as just an example. One or more of these desirable characteristics may be better understood in reference to one or more of the graphs of FIG. 4, below.

Figure 4:
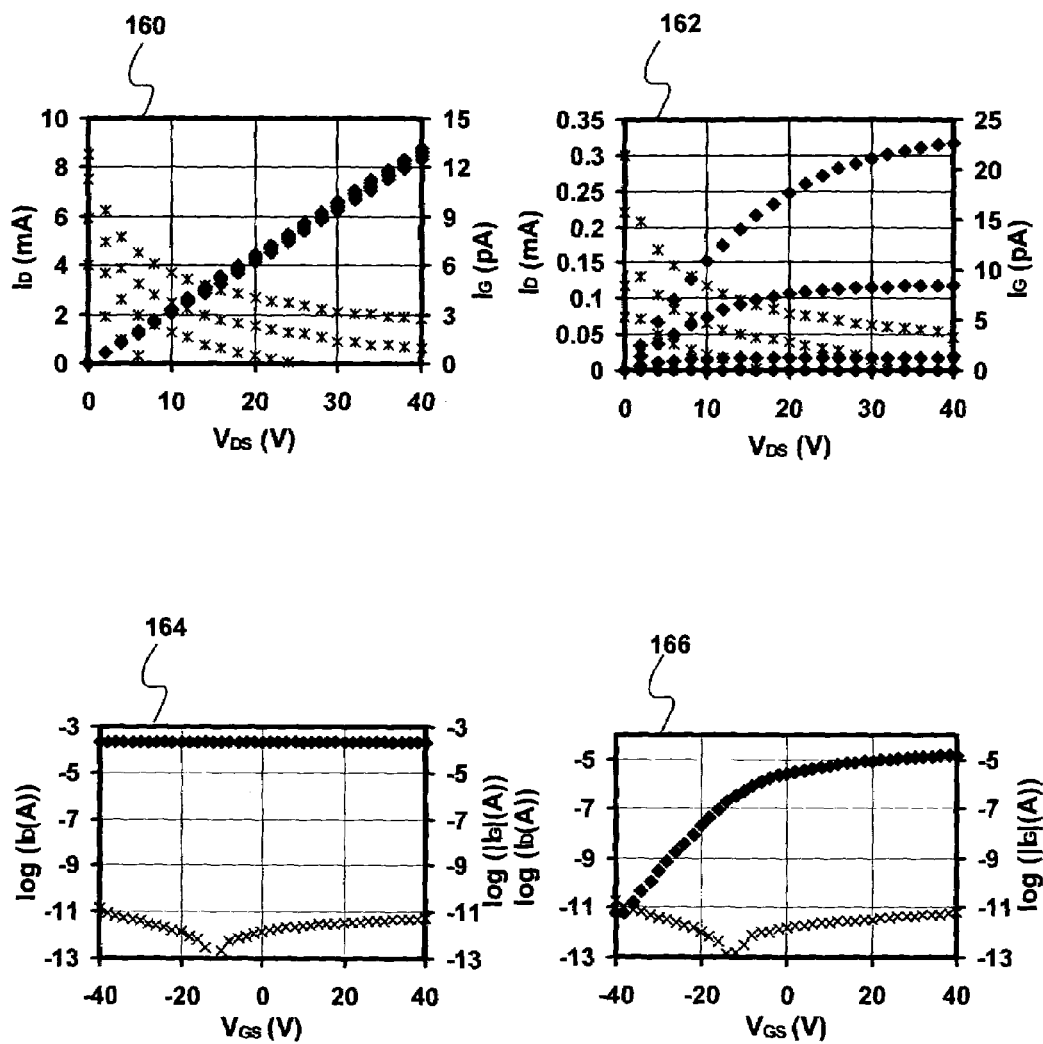
FIG. 4 illustrates one or more characteristics of an embodiment of a solution processed device, such as the devices illustrated in FIG. 1 and/or FIG. 2.

Referring now to FIG. 4, there are illustrated multiple characteristics of a device, such as a device formed in accordance with one or more of the foregoing embodiments. Illustrated in FIG. 4 are graphs 160, 162, 164 and 166. Graph 160 illustrates characteristics of a thin film transistor having a dielectric layer comprised of a single organic material. Conversely, Graph 162 illustrates characteristics of a thin film transistor having a dielectric layer comprised of one or more organic and one or more inorganic materials. In the aforementioned graphs, drain current ($I_D$) is indicated by diamonds, and gate current ($I_G$) is indicated by 'x's. As can be seen from graph 160, when utilizing a single material, when operating the device under test conditions at varying gate to source voltages ($V_{GS}$) ranging from −40 to +40 volts DC, the drain current $I_D$, indicated by diamonds, at a given drain to source voltages ($V_{DS}$) will not vary substantially, which may result in a device that may not be able to switch off efficiently, for example. Conversely, referring now to graph 162, a device having a dielectric layer comprised of one or more organic and inorganic materials may exhibit switching properties differing from that of a device having a single material layer for a dielectric layer, and the drain current, indicated by diamonds and illustrated as multiple curves representing varying $V_{GS}$ values, may exhibit substantial variations when operating the device at differing gate to source voltages $V_{GS}$ ranging from −40 to +40 volts DC, which may result in a device that is more responsive to voltages, and may provide switching functions different from a device having a single material layer. For example, the multiple curves illustrated, as oriented highest to lowest on graph 162, represent $V_{GS}$ values of +40 volts DC, +20 volts DC, 0 volts DC, −20 volts DC, and −40 volts DC, respectively. Additionally, graphs 160 and 162 demonstrate that gate current $I_G$ leakage may not vary substantially when utilizing a device having a dielectric layer comprised of one or more organic and inorganic materials, as compared to a device having a single material layer for a dielectric layer, even though the device having a dielectric layer comprised of one or more organic and inorganic materials may provide switching functions that differ from a device having a dielectric layer comprising one material, for example.

Additionally, referring to graphs 164 and 166, characteristics of a device such as formed in accordance with one or more of the aforementioned embodiments may be further demonstrated. Graph 164 illustrates log scale characteristics of a device having a dielectric layer comprised of a single organic material. Conversely, Graph 166 illustrates log scale characteristics of a device having a dielectric layer comprised of one or more organic and inorganic materials. As can be seen from graph 164, when utilizing a single material, when operating the device under test conditions at varying gate to source voltages $V_{GS}$, and while operating the device under test conditions wherein the drain to source voltage $V_{DS}$ is +10 volts DC, the drain current $I_D$ will not vary greatly. Referring now to graph 166, similarly to graph 162, a device having a dielectric layer comprised of one or more organic and inorganic materials may exhibit switching properties differing from that of a device having a single material layer for a dielectric layer, and the drain current may exhibit variations when operating the device at differing gate to source voltages. Additionally, graphs 164 and 166 demonstrate that gate current $I_G$ leakage may not vary substantially when utilizing a device having a dielectric layer comprised of one or more organic and inorganic materials, as compared to a device having a single material layer for a dielectric layer.

It is, of course, now appreciated, based at least in part on the foregoing disclosure, that software may be produced capable of performing a variety of operations, including one or more of the foregoing operations, which may be implemented in a system suitable for forming a solution processed device, as described previously. It will additionally be understood that, although particular embodiments have just been described, claimed subject matter is not limited in scope to a particular embodiment or implementation. For example, a system capable of implementing one or more of the foregoing operations described in reference to FIG. 3 may comprise hardware, such as implemented to operate on a device or combination of devices as previously described, for example, whereas another embodiment may be in software. Likewise, an embodiment of a system capable of implementing one or more of the abovementioned operations may be implemented in firmware, or as any combination of hardware, software, and/or firmware, for example. Additionally, all or a portion of one embodiment may be implemented to operate at least partially in one device, such as an ejection device, a laser device, a display, a computing device, a set top box, a cell phone, a personal data assistant (PDA), and/or a smart package, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, a set top box, a cell phone, a personal data assistant (PDA), and/or a smart package, and/or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, claimed subject matter is not limited in scope to this example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method, comprising: depositing a first material over at least a portion of a substrate by use of one or more solution processes to form a first material layer, at least a portion of said first material layer comprising inorganic dielectric material;
    depositing a second material over and/or in contact with said at least a portion of said first material layer by use of one or more solution processes to form a second material layer, at least a portion of said second material layer comprising organic dielectric material, to form at least a portion of a dielectric device layer; and
    wherein the inorganic dielectric material is formed from nanoparticles of silicon dioxide suspended in a solvent of water, glycol, and/or alcohol.

2. The method of claim 1, and further comprising: altering said at least a portion of said first and/or said second material layer at least in part.

3. The method of claim 2, wherein said altering substantially comprises one or more of: solidification, ablation, crystallization, removal, curing, polymerization, densification, and/or patterning.

4. The method of claim 1, wherein said depositing said first material and said depositing said second material substantially comprises differing processes.

5. The method of claim 1, wherein said one or more solution processes comprises one or more of the following: an ejection process, a spin coating process, a contact printing process, a dip-coating process, a spray coating process, a curtain coating process, a screen printing process, and/or a chemical bath deposition.

6. The method of claim 5, wherein said one or more solution processes comprises successive ionic layer absorption and/or reaction.

7. The method of claim 5, wherein said ejection process is substantially performed by an ejection device.

8. The method of claim 7, wherein said ejection device comprises a thermal ink jet (TIJ) device.

9. The method of claim 1, wherein said inorganic dielectric material further includes one or more of: zirconium oxide, tin oxide, titanium oxide, tantalum oxide, yttrium oxide, lanthanum oxide, silicon oxide, aluminum oxide, hafnium oxide, barium zirconate titanate, barium strontium titanate, silicon nitride, and/or silicon oxynitride.

10. The method of claim 9, wherein said inorganic dielectric material is formed to a thickness approximately in the range of 1-500 nm.

11. The method of claim 9, wherein said inorganic dielectric material further includes zirconium oxide and is formed to a thickness approximately in the range of 20-100 nm.

12. The method of claim 1, wherein said organic dielectric material substantially comprises one or more of: UV curable acrylic monomer, acrylic polymer, a UV curable monomer, a thermal curable monomer, a polymer solution, a melted polymer, an oligomer solution, a poly methyl methacrylate, a poly vinyiphenol, and/or a benzocyclobutene.

13. The method of claim 12, wherein said organic dielectric material substantially comprises one or more polyimides.

14. The method of claim 12, wherein said organic dielectric material is formed to a thickness approximately in the range of 50-5000 nm.

15. The method of claim 12, wherein said organic dielectric material substantially comprises a UV curable acrylic monomer, and is formed to a thickness approximately in the range of approximately 200-2000 nm.

16. The method of claim 1, wherein at least one of said first and said second materials comprises a solution of particles at least paztially suspended in a solvent.

17. The method of claim 16, wherein the said first material comprises nanoparticles of $SiO_2$ suspended in a solution of water, glycol and/or alcohol, said nanoparticles of $SiO_2$ having a diameter of approximately 20 nanometers, and comprising approximately 15-30% of said solution by weight.

18. The method of claim 1, wherein said substrate substantially comprises at least a portion of a thin film transistor.

19. A method, comprising: a step for depositing a first material over at least a portion of a substrate by use of one or more steps for solution processing, at least a portion of said first material comprising inorganic dielectric material;
a step for curing said first material;
a step for depositing a second material over said at least a portion of said first material by use of one or more steps for solution processing, at least a portion of said second material comprising organic dielectric material, such as to form at least a portion of a dielectric device layer of a thin film device; and
wherein the dielectric device layer allows for a drain current that varies based on a varying gate to source voltage, while a gate current leakage does not vary proportionally to the drain current based on the varying gate to source voltage in the thin film device.

20. The method of claim 19, wherein said step for depositing said first material and said step for depositing said second material substantially comprises one or more differing processing steps.

21. The method of claim 19, wherein said one or more steps for solution processing comprises one or more of the following: an ejection process, a spin coating process, a contact printing process, a dip-coating process, a spray coating process, a curtain coating process, a screen printing process, a chemical bath deposition, and/or successive ionic layer absorption and/or reaction.

22. The method of claim 21, wherein said ejection processes is substantially performed by an ejection device.

23. The method of claim 22, wherein said ejection device comprises a thennal ink jet (TIJ) device.

24. The method of claim 19, wherein said inorganic dielectric material substantially comprises one or more of: zirconium oxide, tin oxide, titanium oxide, tantalum oxide, yttrium oxide, lanthanum oxide; silicon oxide, aluminum oxide, hafnium oxide, barium zirconate titanate, barium strontium titanate, silicon nitride, and/or silicon oxynitride.

25. The method of claim 19, wherein said organic dielectric material substantially comprises one or more of: UV curable acrylic monomer, acrylic polymer, a UV curable monomer, a thermal curable monomer, a polymer solution, a melted polymer, an oligomer solution, a poly methyl methacrylate, a poly vinyiphenol, and/or a benzocyclobutene.

26. The method of claim 25, wherein said organic dielectric material substantially comprises one or more polyimides.

27. The method of claim 19, wherein at least one of said first and said second materials comprises a solution of particles at least partially suspended in a solvent.

28. The method of claim 19, wherein said first material comprises nanoparticles of $SiO_2$ suspended in a solvent of water, glycol and/or alcohol, said nanoparticles of $SiO_2$ having a diameter of approximately 20 nanometers, and comprising approximately 15-30% of said solution by weight.

29. The method of claim 19, wherein said substrate substantially comprises at least a portion of a thin film transistor.

* * * * *

UNITED STATES PATENT AND TRADEMARK OFFICE
CERTIFICATE OF CORRECTION

| | | |
|---|---|---|
| PATENT NO. | : 7,285,501 B2 | Page 1 of 1 |
| APPLICATION NO. | : 10/943606 | |
| DATED | : October 23, 2007 | |
| INVENTOR(S) | : Peter Mardilovich et al. | |

It is certified that error appears in the above-identified patent and that said Letters Patent is hereby corrected as shown below:

On the Title page, item (56), under "Foreign Patent Documents", in column 2, line 2, delete "2067650" and insert -- 2087650 --, therefor.

In column 12, line 46, in Claim 12, delete "vinyiphenol," and insert -- vinylphenol, --, therefor.

In column 12, line 59, in Claim 16, delete "paztially" and insert -- partially --, therefor.

In column 13, line 31, in Claim 23, delete "thennal" and insert -- thermal --, therefor.

In column 14, line 4, in Claim 24, after "lanthanum oxide" delete ";" and insert -- , --, therefor.

In column 14, line 12, in Claim 25, delete "vinyiphenol," and insert -- vinylphenol, --, therefor.

Signed and Sealed this

Eleventh Day of November, 2008

JON W. DUDAS
*Director of the United States Patent and Trademark Office*